(12) United States Patent
Soininen et al.

(10) Patent No.: US 6,447,607 B2
(45) Date of Patent: Sep. 10, 2002

(54) APPARATUS FOR GROWING THIN FILMS

(75) Inventors: Pekka T. Soininen, Helsinki; Vaino Kilpi, Espoo, both of (FI)

(73) Assignee: ASM Microchemistry Oy, Espoo (FI)

( * ) Notice: Subject to any disclaimer, the term of this patent is extended or adjusted under 35 U.S.C. 154(b) by 0 days.

(21) Appl. No.: 09/749,329

(22) Filed: Dec. 27, 2000

(30) Foreign Application Priority Data

Dec. 28, 1999 (FI) .............................................. 19992798

(51) Int. Cl.$^7$ ................................................ C30B 35/00
(52) U.S. Cl. ...................... 117/200; 117/900; 118/719; 118/725; 118/730; 414/217
(58) Field of Search .................. 117/200, 900; 118/719, 725, 730; 414/217

(56) References Cited

U.S. PATENT DOCUMENTS

| | | |
|---|---|---|
| 4,058,430 A | 11/1977 | Suntola et al. |
| 4,389,973 A | 6/1983 | Suntola et al. |
| 4,694,779 A | 9/1987 | Hammond et al. |
| 5,092,728 A | 3/1992 | Crabb et al. |
| 5,288,327 A | 2/1994 | Bhat |
| 5,525,159 A | 6/1996 | Hama et al. |
| 5,628,828 A | 5/1997 | Kawamura et al. |
| 5,810,538 A | 9/1998 | Ozawa et al. |
| 5,855,680 A | 1/1999 | Soininen et al. |

OTHER PUBLICATIONS

Ald Precursor: Chemistry: Evolution and Future Challenges. Leskela et al. Journal de Physique IV, France 9 (1999). 8–837 to 8–582.

Synthesis of Oxide Thin Film and Overlayers by Atomic Layer Epitaxy for Advanced Applications. Niinsto et al.. Materials Science and Engineering B41 (1996). pp. 23–29.

Atomic Layer Epitaxy. Tuomo Suntola. Thin Solid Films, 216 (1992). pp. 84–89.

*Primary Examiner*—Felisa Hiteshew
(74) *Attorney, Agent, or Firm*—Knobbe, Martens, Olson & Bear LLP

(57) ABSTRACT

The invention relates to an apparatus for growing thin films onto the surface of a substrate by exposing the substrate to alternately repeated surface reactions of vapor-phase reactants. The apparatus comprises at least one process chamber having a tightly sealable structure, at least one reaction chamber having a structure suitable for adapting into the interior of said process chamber and comprising a reaction space of which at least a portion is movable, infeed means connectable to said reaction space for feeding said reactants into said reaction space, and outfeed means connectable to said reaction space for discharging excess reactants and reaction gases from said reaction space, and at least one substrate adapted into said reaction space. At least one loading chamber is arranged to cooperate with said process chamber so as to permit said reaction space or a portion thereof to be moved into said process chamber and away from said process chamber and, further, the operating pressure of the loading chamber is arranged to be controllable independently from said pressure chamber.

13 Claims, 2 Drawing Sheets

APPARATUS FOR GROWING THIN FILMS

PRIORITY INFORMATION

This application claims the priority benefit under 35 U.S.C. §119 to Finnish patent application No. 19992798, filed Dec. 28, 1999, the entire content of which is hereby expressly incorporated by reference.

FIELD OF THE INVENTION

The present invention relates to an apparatus according for growing thin films on a surface of a substrate. More particularly, the present invention relates to an apparatus for producing thin films on the surface of a substrate by subjecting the substrate to alternately repeated surface reactions of vapor-phase reactants.

DISCUSSION OF RELATED ART AND SUMMARY OF THE INVENTION

Conventionally, thin-films are grown using vacuum evaporation deposition, the Molecular Beam Epitaxy (MBE) and other similar vacuum deposition methods, different variants of the Chemical Vapor Deposition (CVD) method (including low-pressure and organometallic CVD and plasma-enhanced CVD) or a deposition method of alternately repeated surface reactions called the Atomic Layer Epitaxy (ALE) method or Atomic Layer Deposition (ALD).

In MBE and CVD methods, the thin film growth rate is determined by the concentrations of the provided starting material in addition to other process variable. To achieve a uniform thickness of the layers deposited by these methods, the concentrations and reactivities of starting materials must be carefully kept constant on different surface areas of the substrate. If the different starting materials are allowed to mix with each other prior to reaching the substrate surface, as is the case in the CVD method, for instance, a chance of their mutual reaction arises. Then, a risk of microparticle formation already within the infeed channels of the gaseous reactants is imminent. Such microparticles generally have a deteriorating effect on the quality of the deposited thin film. Therefore, the possibility of premature reactions in MBE and CVD reactors, for instance, is avoided by heating the starting materials not earlier than at the substrate surfaces. In addition to heating, the desired reaction can be initiated using, e.g., a plasma discharge or other similar activating means.

In the MBE and CVD processes, the growth of thin films is primarily adjusted by controlling the infeed rates of starting materials impinging on the substrate. In contrast, the growth rate in the ALE process is controlled by the substrate surface qualities, rather than the starting material concentrations or flow variables. The only prerequisite in the ALE process is that the starting material is available in sufficient concentration to saturate the surface of the substrate. The ALE method is described, e.g., in FI patent publications 52,359 and 57,975 and in U.S. Pat. Nos. 4,058,430 and 4,389,973. Furthermore, equipment constructions suited to implement this method are disclosed in patent publications U.S. Pat. No. 5,855,680 and FI 100,409. Apparatuses for growing thin films are also described in the following publications: Material Science Report 4(7) (1989), p. 261, and Tyhjiötekniikka (Finnish publication for vacuum techniques), ISBN 951-794-422-5, pp. 253–261. These references are incorporated herein by reference.

In the ALE growth method described in FI Pat. No. 57,975, the reactant atoms or molecules are arranged to sweep over the substrates, thus impinging on their surface until a fully saturated molecular layer is formed thereon. Next, the excess reactant and the gaseous reaction products are removed from the substrates with the help of inert gas pulses passed over the substrates or, alternatively, by pumping the reaction space to a vacuum before the next gaseous pulse of a different reactant is admitted. The succession of the different gaseous reactant pulses and the diffusion barriers formed by the separating inert gas pulses or cycles of vacuum pumping result in a thin film growth controlled by the individual surface-chemical reactions of all these components. If necessary, the effect of the vacuum pumping cycle may be augmented by the inert gas flow. For the function of the process, it is typically irrelevant whether the gaseous reactants or the substrates are kept in motion; it only matters to keep the different reactants of the successive reactions separate from each other and to have them sweep successively over the substrate.

Most vacuum evaporators operate on the so-called "single-shot" principle. In such an arrangement, a vaporized atom or molecule can impinge on the substrate only once. If no reaction with the substrate surface occurs, the atom/molecule rebounds or is revaporized so as to hit the apparatus walls or the vacuum pump, undergoing condensation therein. In hot-walled reactors, an atom or molecule that collides with the process chamber wall or the substrate can undergo revaporization and, hence, repeated impingements on the substrate. When applied to ALE process chambers, this "multi-shot" principle can offer a number of benefits including improved efficiency of material consumption.

ALE reactions operating on the "multi-shot" principle generally are designed for the use of a cassette unit in which a plurality of substrates can be taken simultaneously into the process chamber. In a modified arrangement, the substrates can be placed unmountedly into the process space formed by a pressure vessel, whereby the process space also serves as the reaction chamber wherein the vapor-phase reactants are reacted with the substrate surface in order to grow thin film structures. If a cassette unit designed for holding several substrates is employed, the reaction chamber is formed in the interior of the cassette unit. Use of a cassette unit shortens the growth time per substrate in respect to single-substrate cycling, whereby a higher production throughput is attained. Furthermore, a cassette unit arranged to be movable into and out from the process chamber can be dismantled and cleaned without interrupting the production flow because one cassette unit can be used in the process chamber while another one is being cleaned.

Batch processing is preferred in conventional ALE thin film processes because of the relatively slow production pace of the ALE method relative to other thin film growth techniques. The overall growth time per substrate of a thin film structure can be reduced in a batch process to a more competitive level. For the same reason, larger substrate sizes are also preferred.

In the deposition of thin films, the goal is to keep the process chambers continually running under controlled process conditions as to the temperature, pressure and other process parameters so that particulate matter of the ambient air and other chemical impurities cannot reach the substrates. Additionally, this arrangement eliminates the heating/cooling cycles that impair the reliability of process chambers and are time-consuming. Generally, a separate loading chamber is employed that is continually kept under a vacuum and to which the reactors are connected. Substrate loading thereto and unloading therefrom is accomplished by taking both the process chamber and the loading chamber to a vacuum, after which a valve between both chambers is opened and a robotic arm adapted into the loading chamber removes the processed substrate and loads a new substrate into the process chamber. Subsequently, the valve is closed and the process may be started after the substrate and the process chamber have attained the proper process conditions. Next, the processed substrate is moved via another controllable valve from the loading chamber to an air lock pumped to a vacuum, after which the valve is closed. Subsequently, the air lock can be pressurized, whereby the substrate can be removed from the system via a third valve opening into the ambient space. The new substrate to be processed is taken in the same fashion via the loading chamber into the process chamber.

Currently, process apparatuses equipped with this type of a loading chamber are available for single substrates only and they are not suited for accommodating heavy substrate cassette units. Depending on the batch and substrate size, such cassette units may weigh up to 200 kg, whereby devices designed for their handling must have a sturdy construction. Moreover, the lubrication of bearings and other similar components of the transfer means is problematic, because the lubricant required herein may affect the structure of the thin film to be grown.

The large cassette units used in conventional ALE deposition processes are assembled outside the process apparatus, after which the process chamber is opened and the cassette units are transferred as assembled entities into the process chamber. In the process chamber,. the cassette unit is heated typically for 1–4 hours, processed for 2–4 hours and cooled up to ten hours depending on the cassette unit size. Furthermore, the assembly/disassembly of the cassette unit is a time-consuming operation. The ratio of the processing time vs. the work time required for other operations becomes even more disadvantageous when thin films of extremely shallow thickness (e.g., in the range 1–50 nm) are to be grown and the growth period may take from one minute to a few minutes. Under these circumstances, a major portion of the overall process cycle time in regard to the actual thin film growth period is lost in heating/cooling the reaction chamber structures, pressurizing the reactor, disassembling and reassembling the reaction chamber, pumping to a vacuum and reheating the system.

It is therefore an object of the present invention to provide an novel type of ALE apparatus that reduces the amount of time lost in heating/cooling the reaction chamber structures, pressurizing the reactor, disassembling and reassembling the reaction chamber, pumping to a vacuum and reheating the system.

Accordingly, one aspect of the invention involves equipping the process chamber with a separate loading chamber that can be pressurized independently from the process chamber so that the loading of the cassette unit into the process chamber can be carried out under a vacuum or a low-pressure inert gas atmosphere. The loading chamber can be complemented with preheating/cooling stations to shorten the overall processing cycle time. In a modified arrangement, a plurality of process chambers can be connected to each loading chamber. For moving the cassette unit, the reactor is provided with a transfer mechanism capable of accurately and sealably placing the cassette unit into its proper position in the process chamber and removing the same therefrom.

More specifically, the invention relates an apparatus that comprises at least one process chamber having a tightly sealable construction, at least one into the interior of said process chamber adaptable reaction chamber including a reaction space of which at least a portion is movable, infeed means connected to the reaction space for feeding reactants into the reaction space and outfeed means connected to the reaction space for discharging excess reactants and reaction gases from the reaction space, and at least one substrate adapted into said reaction space. The apparatus further includes at least one loading chamber in which the reaction space can be moved into and away from the process chamber and whose operating pressure can be controlled independently from said process chamber.

The invention offers significant benefits. For example, with the help of the loading chamber, the cassette unit can be moved into the process chamber and out therefrom so that the process chamber is at all times kept under stabilized process conditions. Hence, the steps of heating, pressurizing and pumping to a vacuum need not be carried out for the entire process chamber, but instead, for the substrates only, thus improving the efficiency of process chamber vastly. Owing to the use of the loading chamber, the interior parts of the process chamber are isolated from a direct connection to the ambient air, whereby the number of detrimental particles in the process chamber is reduced. The transfer mechanism employed in the embodiment of the invention is capable of moving relatively heavy cassette unit constructions and locating them accurately in a desired position within the process chamber. In another modified arrangement, a single loading chamber can be connected to a plurality of process chambers adapted to produce different kinds of thin film structures so that a plurality of thin-film layers can be grown without the need for intermediate transfer of the cassette units to ambient air atmosphere. This reduces the risk of possible contamination and the required number of thermal cycles.

It should be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

It should also be noted that all of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

In the following, the invention will be described in greater detail with the help of exemplifying embodiments illustrated in the appended drawings, in which.

DETAILED DESCRIPTION IF THE PREFERRED EMBODIMENT

Figure 1:
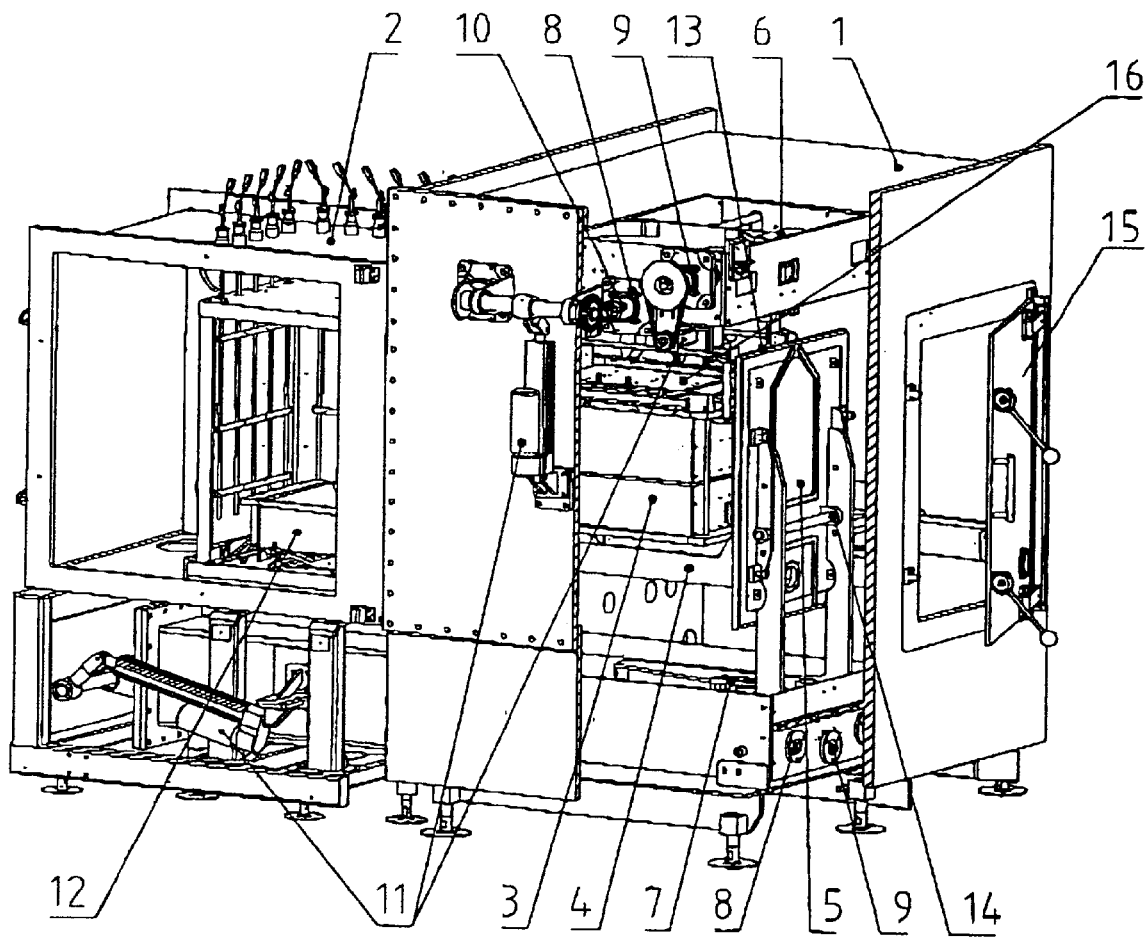
FIG. 1 is a partially sectional view of an embodiment of the apparatus according to the invention.

In the context of the present invention, the term "reactant" refers to a gas or a vaporizable solid or liquid starting material capable of reacting with the surface of the substrate. The ALE method conventionally uses reactants selected from two separate groups. The term "metallic reactants" is used of metallic compounds which may even be elemental metals. Suitable metallic reactants are the halogenides of metals including chlorides and bromides, for instance, and organometallic compounds such as the thd complex compounds. As examples of such metallic reactants are Zn, $ZnCl_2$, $Ca(thd)_2$, $(CH_3)_3Al$ and $Cp_2Mg$. The term "nonmetallic reactants" is used for compounds and elements capable of reacting with metallic compounds. The latter group is appropriately represented by water, sulfur, hydrogen sulfide and ammonia.

In the present context, the term "protective gas" is used when reference is made to a gas which is admitted into the reaction space and is capable of preventing undesired reactions related to the reactants and, correspondingly, the substrate. Such reactions include e.g. the reactions of reactants and the substrate with possible impurities. The protective gas also serves to prevent reactions between substances of different reactant groups in, e.g., the infeed piping. In the method according to the invention, the protective gas is also advantageously used as the carrier gas of the vapor-phase pulses of the reactants. According to a preferred embodiment, in which reactants of different reactant groups are admitted via separate infeed manifolds into the reaction pace, the vapor-phase reactant pulse is admitted from one infeed channel while the protective gas is admitted from another infeed channel thus preventing admitted reactants from entering the reactant infeed channel of another reactant group. Examples of suitable protective gases are inert gases such as nitrogen and noble gases, e.g., argon. The protective gas may also be an inherently reactive gas such as hydrogen gas selected to prevent undesirable reactions (e.g., oxidization reactions) from occurring on the substrate surface.

According to the invention, the term "reaction chamber" includes both the reaction space in which the substrate is located and in which the vapor-phase reactants are allowed to react with the substrate in order to grow thin films as well as the gas infeed/loutfeed channels communicating immediately with the reaction space. The channels serve to admit the reactants into the reaction space (infeed channels) or to remove the gaseous reaction products and excess reactants of the thin-film growth process from the reaction space (outfeed channels). A substrate located in this kind of reaction chamber is subjected to alternately repeated surface reactions of at least two different reactants used for producing a thin film. The vapor-phase reactants are admitted repetitively and alternatingly, each reactant being fed separately from its own source into the reaction chamber, where they are allowed to react with the substrate surface for the purpose of forming a solid-state thin film product on the substrate. Reaction products which have not adhered onto the substrate and any possible excess reactant are removed from the reaction chamber in the vapor phase.

Herein, the term "substrate surface" is used to denote that surface of the substrate onto which the vapor-phase reactant flowing into the reaction chamber impinges. In practice, said surface, during the first cycle of the thin-film growing process is constituted by the surface of a substrate such as glass, for instance, or some other starting surface; during the second cycle the surface is constituted by the layer formed during the first cycle and comprising the solid-state reaction product which is deposited by the reaction between the reactants and is adhered to the substrate, etc.

The term "process chamber" is used when reference is made to the space in which the thin film growth process is carried out and which is isolated from its environment in a tightly sealable manner. The reaction chamber is located in the process chamber and, further, a single process chamber may incorporate a plurality of reaction chambers.

Now referring to FIG. 1, an apparatus having certain features and advantages according to the present invention is illustrated. The apparatus construction includes a loading chamber 1, which also serves as a loading gate, whose wall is partially sectioned in the Figure to elucidate the interior of the chamber 1. The illustrated apparatus also includes a cold-walled process chamber 2, which is illustrated with one wall partially sectioned to elucidate the interior of the chamber. A cassette unit 3, which contains substrates and acts as the process space, is shown resting on supports, such as, for example, forks 4, which are preferably mounted on a door 5 that, as will be explained below, separates the loading chamber 1 from the process chamber 2. Above the cassette unit 3 is adapted a sprayhead 16, which contains the reactant infeed channels. In the process chamber 2 is a suction box 12, which is preferably permanently mounted. The cassette unit 3 and the sprayhead 16 can be mounted above the suction box 12. The illustrated suction box 12 preferably houses the outfeed means of reaction gases and excess reactants. The cassette unit 3, the sprayhead 16 and the suction box 12 together form the reaction chamber.

As mentioned above, the door 5 that also serves as the gate valve between the loading chamber 1 and the process chamber 2. An actuator mechanism 7 is adapted to move the door 5 within the loading chamber 1. A lateral transfer mechanism 6 is located above the cassette unit 3. In the illustrated arrangement, the later transfer mechanism is adapted to grip the cassette unit 3 during the lifting thereof by means of hooks. Both the actuator mechanism 7 and the top-side lateral transfer mechanism 6 of the door 5 can use an eccentric cam 8 for actuating the lift movement and a ball screw 9 for actuating the horizontal movement. One advantage of these arrangements is a reliably tightly sealed implementation of rotary motion feedthroughs 10. The electrical actuators 11 of the transfer means 6, 7, 8, 9 can be located outside the loading chamber 1 and the process chambers 2. Such an arrangement can avoid subjecting the electrical actuators 11 to breakthrough problems that may occur under a vacuum. Moreover, this arrangement makes the maintenance of the actuators 11 easier.

In use, the cassette unit 3 with the substrates placed therein and the sprayhead 16 are transferred via a door 15 into the loading chamber 1. The door 15 is then closed. As the steps of the ALE process are typically carried out at a pressure of about 0.1–30 mbar, the loading chamber 1 after the door 15 is closed is preferably pumped to a pressure lower than the process pressure. For this purpose, the loading chamber 1 is preferably equipped with a separate vacuum pump dedicated to this task. After vacuum pumping, the door 5 separating the loading chamber 1 from the process chamber 2 is preferably opened with the help of the door actuator mechanism 7. The door 5 preferably is arranged to move in the interior of the loading chamber in a direction essentially orthogonal to its seal surface. The lateral transfer mechanism 6, which is preferably locked to the top of the cassette unit 3 by means of hooks, transfers the cassette unit 3 with the sprayhead 16 onto vertically movable lift, such as, for example forks 4 mounted on the side of the door 5 facing the process chamber 2. Subsequently, the lateral transfer mechanism 6 is detached from the cassette unit 3. The door can then be moved towards the process chamber 2 and the cassette unit 3 with the sprayhead 16, which are resting on the forks 4, can be lowered onto the suction box 12.

Preferably, the cassette unit 3 is lowered onto the suction box when the door 5 is approximately 10–20 mm from a closed position of the door 5. In such an arrangement, the forks 4 mounted on the door 5 are released before the end of the downward motion as the cassette unit 3 rests on the suction box 12. This arrangement relieves the door 5 from the additional load of the cassette unit 3 when it is closed. This makes it easier for the door 5 to mate with its seat surface and thus impose a uniform linear pressure on the seal 13 as required for an efficient seal. The seating step can be further facilitated by providing a pivoting mount 14 for the door 5.

In the illustrated arrangement, the cassette unit 3, the sprayhead 16 and the suction box 12 form a reaction chamber wherein the vapor-phase reactants are allowed to react with the substrate in order to grow thin films. The infeed channels in the sprayerhead 16 serve to admit the reactants into the reaction space between the substrates and outfeed channels in the suction box 12 serve to remove the gaseous reaction products and excess reactants of the thin-film growth process from the reaction space . The substrates located are preferably subjected to alternately repeated surface reactions of at least two different reactants used for producing a thin film. The vapor-phase reactants are admitted repetitively and alternatingly, each reactant preferably being fed separately from its own source into the reaction chamber, where they are allowed to react with the substrate surface for the purpose of forming a solid-state thin film product on the substrate. Reaction products which have not adhered onto the substrate and any possible excess reactant are removed from the reaction chamber in the vapor phase. Of course, to perform the above-described processes, the illustrated apparatus preferably includes a suitably configured controller.

After the processing steps are completed, the cassette unit 3 with the above-lying sprayhead 16 is preferably lifted off from above the suction box 12 by means of the forks 4. Next, the door 5 is opened and the cassette unit 3 is moved on the forks 4 into the loading chamber 1. The lateral transfer mechanism 6 grips the cassette unit 3, preferably at its top, and transfers the cassette unit 3 with the above-lying sprayhead 16 from the forks 4 to in front of the door 15 of the loading chamber 1. After the door 5 is closed, the loading chamber 1 can be pressurized and the cassette unit 3 removed from the loading chamber 1. Removal of the cassette unit 3 from the loading chamber 1 and loading of a new cassette unit into the loading chamber 1 can be performed using, e.g., a carriage equipped with a fork lift mechanism.

Thermal expansion of the suction box 12 and the cassette unit 3 may impose thermal stresses on the suction box 12 if it is supported to the process chamber 2 by. for example, its edges. The magnitude of such thermal expansion may mount up to several millimeters. These dimensional changes may complicate some process steps, such as, for example, the positioning of the cassette unit 3 in the process chamber 2 during the automated unload/load steps. Hence, the suction box 12 is preferably supported to the wall structures of the process chamber 2 so that the center of the support point coincides at least substantially with the center point of the suction box 12. This provides the suction box 12 with a greater degree of freedom to expand outward from its support point and the positioning accuracy of the cassette unit 3 is improved.

Figure 2:
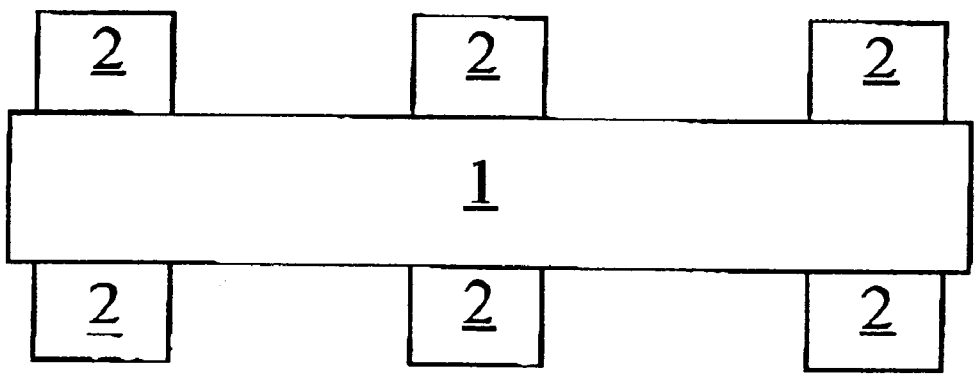
FIG. 2 is a layout diagram of another embodiment of the apparatus according to the invention.

A modified arrangement of the present invention is illustrated schematically in FIG. 2. In this arrangement, the loading chamber 1 is made wider in its lateral dimension so as to provide the loading chamber 1 with additional cassette unload sites by extending the reach of the lateral transfer mechanism 6. Thus, a single loading chamber 1 can be connected to a plurality of process chambers 2. In such an arrangement, the process chambers 2 can be adapted to produce, for example, different types of thin-film structures or to run the different steps of a given thin-film growth process. The use of the expanded loading chamber 1 offers a shorter processing time per substrate and other salient benefits.

In addition to those described above, the invention may have additional modified arrangements. For example, a single process chamber 2 may be adapted to house a plurality of reaction chambers. Furthermore, the loading chamber 1 may be complemented with an intermediate station serving to heat the cassette unit 3 prior to its transfer into the process chamber 2 and/or to cool the cassette unit 3 prior to its transfer of out from loading chamber 1. Such an arrangement can improve the throughput capacity of the process chamber 2. In another modified arrangement, the cassette unit 3 can be transferred from the ambient air atmosphere into loading chambers 1 having a plurality of unload positions for cassette units 3 and respectively removed via separate pressurizing chambers. In such an arrangement, there is no need for pressurizing the large-volume loading chamber 1 in conjunction with the transfer of the cassette unit 3.

In yet another modified arrangement, a gate valve can be used in addition to or instead of a door 4 for sealing the process chamber 2 from the loading chamber 1. In still yet another modified arrangement, the cassette unit 3 need not have a construction that must be moved as an entity. For example, the interior of the cassette unit 3 may be provided with a holder into which the substrates are placed. The holder can then moved from the loading chamber 1 into the process chamber 2 and then away from the process chamber 2.

It should be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Moreover, although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof In addition, while a number of variations of the invention have been shown and described in detail, other modifications, which are within the scope of this invention, will be readily apparent to those of skill in the art based upon this disclosure. For example, it is contemplated that various combination or subcombinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An apparatus for growing thin films onto the surface of a substrate by exposing the substrate to alternate surface reactions of vapor-phase reactants, the apparatus comprising:
  - at least one process chamber having a substantially sealed structure;
  - at least one reaction chamber comprising a reaction space of which at least a portion is movable, an inlet connectable to said reaction space for feeding said reactants into said reaction space, and outlet connectable to said reaction space for discharging excess reactants and reaction gases from said reaction space;
  - at least one substrate located within said reaction space; and
  - at least one loading chamber which is in selective communication with said process chamber so as to permit said reaction space or a portion thereof to be moved from said loading chamber into said process chamber and from said process chamber to said loading chamber.

2. The apparatus according to claim 1, where an operation pressure within said at least one loading chamber can be controlled independently from an operation pressure within said process chamber.

3. The apparatus according to claim 1, wherein a door separates said process chamber from said loading chamber, said door being adapted to be movable in the interior of said loading chamber in a direction substantially perpendicular to a backing surface of said door.

4. The apparatus according to claim 3, wherein the door includes supports that face said process chamber and are adapted to be moved in the vertical direction so as to be capable of transferring said reaction space or a portion thereof from said loading chamber to said process chamber.

5. The apparatus according to claim 1, wherein the process chamber and said loading chamber are separated from each other by a gate valve.

6. The apparatus according to claim 1, wherein said outlet is permanently mounted in said process chamber.

7. The apparatus according to claim 1, wherein said inlet is moveable with said reaction space from said loading chamber to said process chamber.

8. The apparatus according to claim 1, further including electrical actuators configured to actuate movement of said reaction space, said electrical actuators being located on an exterior side of said process chamber and said loading chamber.

9. The apparatus according to claim 1, wherein said loading chamber is adapted to operate a cooling station for said reaction space.

10. The apparatus according to claim 1, wherein said loading chamber is adapted to operate as a preheating station for said reaction space.

11. The apparatus according to claim 1, wherein said loading chamber is in selective communication with a plurality of process chambers that are adapted to produce thin-film structures of different types.

12. The apparatus according to claim 1, wherein said loading chamber is in selective communication with a plurality of process chambers that are adapted to produce thin-film structures of a same type.

13. The apparatus according to claim 1, wherein said reaction chamber is supported said process chamber with supports that are adapted to substantially with a center point of said outlet.

* * * * *